United States Patent
Roguszczak

(10) Patent No.: US 12,083,522 B2
(45) Date of Patent: Sep. 10, 2024

(54) DEVICE FOR CONDUCTING BIOLOGICAL AMPLIFICATION REACTIONS

(71) Applicant: TERRABIO SPOLKA Z OGRANICZONA ODPOWIEDZIALNOSCIA, Wroclaw (PL)

(72) Inventor: Henryk Waldemar Roguszczak, Wroclaw (PL)

(73) Assignee: TERRABIO SPOLKA Z OGRANICZONA ODPOWIEDZIALNOSCIA, Wroclaw (PL)

( * ) Notice: Subject to any disclaimer, the term of this patent is extended or adjusted under 35 U.S.C. 154(b) by 716 days.

(21) Appl. No.: 17/296,384

(22) PCT Filed: Nov. 26, 2019

(86) PCT No.: PCT/PL2019/050067
§ 371 (c)(1),
(2) Date: May 24, 2021

(87) PCT Pub. No.: WO2020/111958
PCT Pub. Date: Jun. 4, 2020

(65) Prior Publication Data
US 2022/0032308 A1 Feb. 3, 2022

(30) Foreign Application Priority Data
Nov. 26, 2018 (PL) .......................................... 427869

(51) Int. Cl.
*B01L 7/00* (2006.01)
*H05B 1/02* (2006.01)
(Continued)

(52) U.S. Cl.
CPC .............. *B01L 7/52* (2013.01); *H05B 1/0247* (2013.01); *H05B 3/48* (2013.01); *H05K 1/0272* (2013.01);
(Continued)

(58) Field of Classification Search
CPC ................ B01J 19/0093; B01J 19/0046; B01J 2219/00495; B01L 7/52; B01L 7/54;
(Continued)

(56) References Cited

U.S. PATENT DOCUMENTS

| | | | |
|---|---|---|---|
| 6,558,947 B1 | 5/2003 | Lund et al. | |
| 2004/0001780 A1 | 1/2004 | Schirr et al. | |
| 2005/0028587 A1 | 2/2005 | Baer et al. | |

FOREIGN PATENT DOCUMENTS

| | | |
|---|---|---|
| DE | 2643449 A1 | 3/1978 |
| WO | 2012/063011 A2 | 5/2012 |
| WO | 2015/068038 A2 | 5/2015 |

OTHER PUBLICATIONS

International Search Report, PCT/PL2019/050067, mailed Mar. 17, 2020.

*Primary Examiner* — Lessanework Seifu
(74) *Attorney, Agent, or Firm* — Arrigo, Lee, Guttman & Mouta-Bellum LLP

(57) ABSTRACT

The object of the invention is a device for conducting amplification reaction of biological samples with a system for independent control of the temperature of test tubes in a heating assembly comprising a multipart heating slot located in the cooling system housing, characterised in that the heating assembly comprises at least one heating slot (100) comprising a metal heating sleeve (101) wound around with a bifilar winding wire made of enamelled winding wire (102), which is covered with a composite polymer layer (103), wherein a temperature sensor (104) is located on the surface of the winding wire, and at least one heating slot is
(Continued)

Figure 1A:
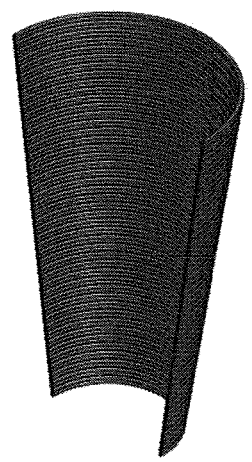

mounted on the PCB control board (105) located on the cooling system housing (112).

16 Claims, 9 Drawing Sheets

(51) Int. Cl.
*H05B 3/48* (2006.01)
*H05K 1/02* (2006.01)
(52) U.S. Cl.
CPC . *B01L 2200/147* (2013.01); *B01L 2300/0654* (2013.01); *B01L 2300/1827* (2013.01); *B01L 2300/1844* (2013.01); *H05B 2203/014* (2013.01)
(58) Field of Classification Search
CPC .................. B01L 7/00; B01L 220/147; B01L 2300/0654; B01L 2300/1827; B01L 2300/1844; B01L 2300/1833
See application file for complete search history.

DEVICE FOR CONDUCTING BIOLOGICAL AMPLIFICATION REACTIONS

The object of the invention is a heating-cooling assembly, with simultaneous measurement of fluorescence spectrum, particularly for use in devices, in which a chain amplification reaction of biological samples containing DNA is conducted. The invention is applicable especially for conducting rapid amplification reactions.

A solution of an optical system structure for use in PCR reactors is known from the art. Document CN204356338U discloses a system comprising a fixing plate, an excitation system, a reaction test tube, and a camera. The fixing plate is placed horizontally, the excitation system comprises an optical mounting slot, a light source, and a light guiding column. The light source/light and the mounting base are connected with the plate and the optic fibre column. The excitation filter of the excitation system is located between the light source and the optic fibre column. The column is in contact with the test tube mounting slot through an opening. Under the test tube slot, a through opening is located, enabling recording of emission by means of a camera using a filter. The optical system presented therein is characterised by a high level of complexity, in terms of the number of parts being used. It translates to the its cost and, as a result, applying this solution may significantly raise the effective cost of performed PCR analyses.

Another patent document, AU696482, presents a heating element structure of a device for conducting PCR reaction. The test tubes are placed in a multi-well block in a monolithic heating block. The block comprises hollow, uniformly distributed channels, by which the cooling liquid is supplied. Whereas, the block is placed on a heating plate and closed from the top with a heating cover. The solution is similar to the solutions used so far. Such heating method is characterised by significant inertia, due to the high heat capacity of metals and rapid heating or cooling of samples is not possible. Moreover, there is no possibility to create a uniform temperature gradient in the test tube.

However, in the solution according to document US2011008797A1, the reaction mixture is heated by means of magnetic nanoparticles placed in a magnetic field. The nanoparticles are dispersed in the reaction mixture in the test tube. Next, the test tube is placed inside a magnetic coil with a hollow core. The current flow in the coil produces a magnetic field and thus causes an increase in temperature of the nanoparticles and the reaction mixture. As a result, the sample is "contaminated" with an additional substance which needs to be removed in a further step. Moreover, the additional substance makes the person conducting the test dependent on the supply. Without the addition of the nanoparticles, conducting the reaction in conditions of elevated temperature is impossible.

Another solution, US2018136246A1, presents a device for conducting biological reactions and a method for induction heating of a test tube with a reagent. A magnetic core coated with a polymer is placed inside the test tube. Then, the test tube is placed in the reaction slot, wherein each reaction slot comprises its own induction coil. Moreover, it is also provided with a moving element having a second, smaller magnetic core, constituting a magnetic stirrer.

American patent document U.S. Pat. No. 6,558,947B1 discloses a structure of wells for conducting PCR reaction. Each well with a sample is equipped with its own mechanism for independent heating and cooling of the sample, while the heat detection mechanism provides feedback to the controller. The slots have a shape matching the shape of test tubes. In each case, the slot structure is comprised of at least two elements—an insert and an insert housing (heating sleeve). The inner element can be made of a fabric having high heat conductivity. Whereas, the sleeve is made of a copper-beryllium alloy. In one embodiment of the invention, a resistance coil, which allows heating of the sleeve, is located outside or inside the extended base of the sleeve. In another embodiment, the sleeve has an additional resistance layer, a current source is connected to. In yet another embodiment, the current source is connected directly to the sleeve. In another disclosed embodiment, there is no sleeve present, only the insert for the sleeve, comprising two surfaces. The document also discloses heating of the sleeve by means of a plate or hot air. The document also presents a possibility of heating by means of coherent radiation source. The structure of the heating element proposed in the document allows controlling the temperature of each test tube individually.

The technical problem faced by the invention is providing such a design for a device for conducting amplification reaction of biological samples, that would allow precise control of temperature in every test tube, providing independence of its heating, and rapid cooling, with simultaneous low demand for heating power for individual test tube, wherein rapid temperature ramp in a given test tube would be possible, and such a structure should be characterised by low mass, and therefore minimal heat capacity, and low manufacturing cost. Surprisingly, the above problems were solved by the present invention.

The object of the invention is a device for conducting amplification reaction of biological samples with a system for independent control of the temperature of test tubes in a heating assembly comprising a multipart heating slot located in the cooling system housing, a control system, and a power supply system, characterised in that the heating assembly comprises at least one heating slot comprising a metal heating sleeve wound around with a bifilar winding wire made of enamelled winding wire, which is covered with a composite polymer layer, wherein a temperature sensor is located on the surface of the winding wire, and at least one heating slot is mounted on the PCB control board located on the cooling system housing.

In a preferred embodiment, the housing comprises two side walls connected with each other by means of a third wall.

In another preferred embodiment of the invention, the temperature ramp of the heating sleeve is at least 20° C./s.

In a further preferred embodiment of the invention, the temperature sensor is a Pt100 or a Pt1000 sensor.

In another preferred embodiment of the invention, the PCB board is connected to the control system and to the power supply.

In yet another preferred embodiment of the invention, the cross-section profile of the heating slot is circular.

In a further preferred embodiment of the invention, the longitudinal cross-section of the heating slot has a tapered cone shape.

In another, further preferred embodiment of the invention, the thickness of the heating sleeve does not exceed 0.1 mm.

In another preferred embodiment of the invention, the heating sleeve is made of copper.

In a further preferred embodiment of the invention, the winding wire is made of copper.

In a further preferred embodiment of the invention, the winding wire is enamelled with a polyurethane based enamel.

In another preferred embodiment of the invention, the PCB board comprises a slit reducing the heat transfer to the PCB board from the heating slot.

In another preferred embodiment of the invention, an inner chamber comprising the excitation and fluorescence measurement arrangement is located in the housing of the air duct. The excitation and fluorescence measurement arrangement is mounted on the housing of the air duct and comprises: an optic fibre of the fluorescence excitation diode connected to the diode for fluorescence excitation, an optic fibre having a filter for the fluorescence detector connected to the fluorescence detector, wherein the excitation and fluorescence measurement arrangement is separated from the air duct with an insulating surface, through which the optic fibres of the excitation and fluorescence measurement arrangement are introduced. The excitation and fluorescence measurement arrangement is connected to the heating slot by means of optic fibres.

Forming the copper wire section in a shape of spiral cone by tight, bifilar winding, results in a spatial heating surface. Properties of such a spatial heating surface are the following:

- winding of a long, thin, highly conductive copper wire results in high total resistance for electric current and very low transverse heat resistance in the direction of heated polymer test tubes,
- the electrical separation between the heater windings is provided by a polyurethane enamel resistant to high temperatures (the wire working temperature is at least 180° C.), therefore it is possible to wind the wire tightly (one turn next to the other) and obtaining a stable and high heater resistance, (here about 5Ω at working temperature up to 180° C.),
- tight winding of the wire results also in a high packing density of the heater material, which has high heat conductivity, due to being made of copper, therefore a good heat diffusion to the polymer test tube is provided,
- adjusting the heater to the test tube shape is also optimal (minimal mass and therefore heat capacity), which results in rapid heating and cooling of the heater with little amount of supplied energy,
- impedance adjustment to the 5V DC power supply system, which powers the microcontroller and other circuit boards, is also good. For this reason, the device requires only one power supply voltage, and controlling the power is simple and very fast. Supplying a high amount of energy for the heater is achieved in fractions of a microsecond.

Figure 13:
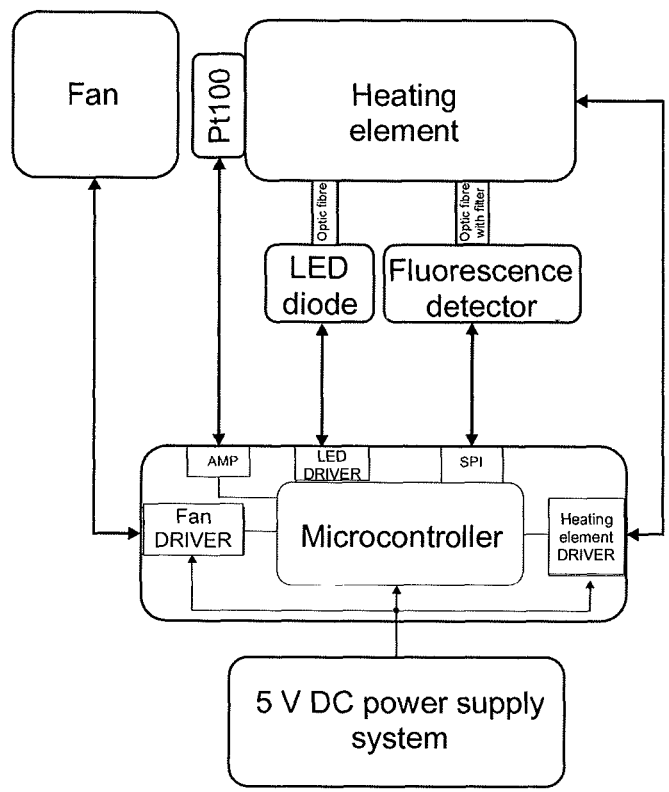

Tightly wound windings form an isothermal surface of a cone with extremely low heat capacity and simultaneously high heat conductivity. The surface temperature may be easily controlled by varying the electrical current flowing through the copper wire using feedback with the temperature sensor located on the cone surface. Feedback is realised in an analog (FIG. 11) or software manner by a fast microcontroller, which serves as a temperature sensor and determines the amount of energy supplied to the heating surface (FIG. 13). This solution enables controlled temperature ramp with a rate of 20° C./s and temperature stabilisation on any required level with very high precision. The temperature ramp rate can additionally be set by software. The present state of the art does not allow such performances due to physical limitations of the heating concept of known systems, namely the heat capacity (mass of the system) and the heat conductivity. By minimising the mass, reduction of the heating power can also be achieved, and as a result saving of the energy consumed by the device.

Figure 2:
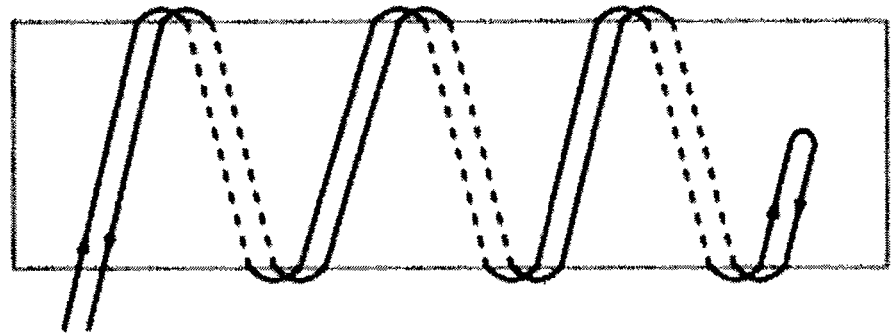

In order to limit the inductance, the winding should be wound in a bifilar manner, such as in FIG. 2. It is important, e.g. with very fast impulse power control using PWM, it results in limiting the surges arising on the inductance elements in case of current switching.

Figure 3:
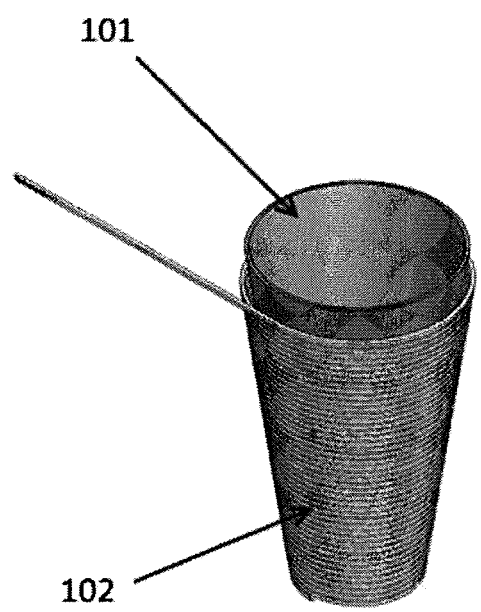
Figure 4:
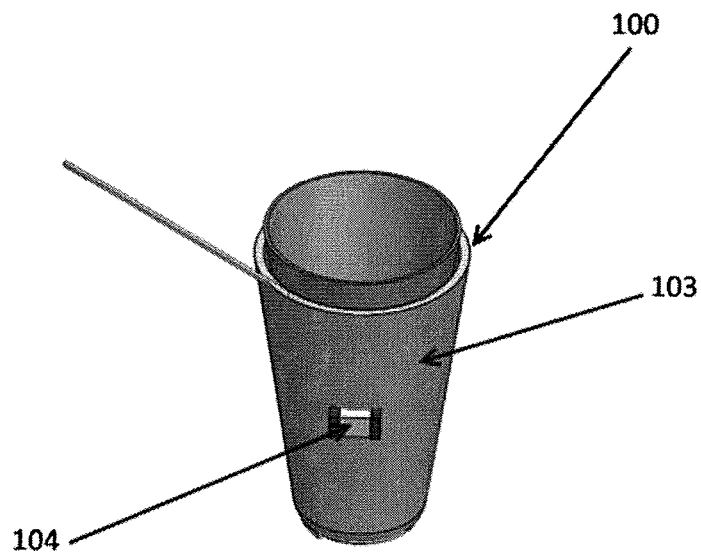

In order to unify the temperature inside the obtained cone, as well as with regard to mechanical durability and the possibility of mounting the heater to the PCB, a properly shaped copper foil having thickness of 0.1 mm is located inside the obtained helix. The material was chosen because of its high heat conductivity, good mechanical properties, and the possibility of soldering to the PCB board using a lead-free alloy. After assembling, a heating element having the desired electrical and mechanical parameters, as well as low heat capacity, is obtained (FIG. 3). In order to reinforce the structure, protect the wire against the influence of outside conditions, and mount the temperature sensor on the outside of the heating element, a thin polymer composite layer, having a high heat conductivity and good thermal and mechanical properties, was deposited (FIG. 4).

The device according to the invention has a number of advantages. First of all, the temperature ramp time above 20° C./s is twice as high as in the fastest devices of this type currently available on the market. A high-voltage power supply is not required—one supply with 5V DC or AC is sufficient. Another significant advantage is that the power required to maintain the temperature on a level of 100° C. is lower than 1 W, which in case of e.g. 8 test tubes gives 8 W, whereas in large commercial devices with heating and cooling solutions using Peltier cells such power is on a level of 800 W. Additionally, in each test tube, an individual synchronic thermal cycle can be established, such function is not present in any device known on the market. The possibility of individual cycle setting for each test tube results in a better adjustment for polymerase reaction parameters in case a test for various pathogens is performed in the same study. As a result, the test has better quality.

Figure 1B:
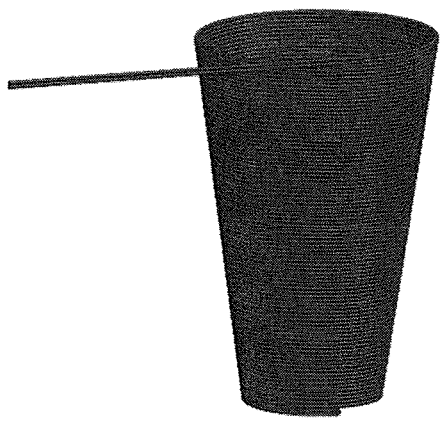
Figure 1C:
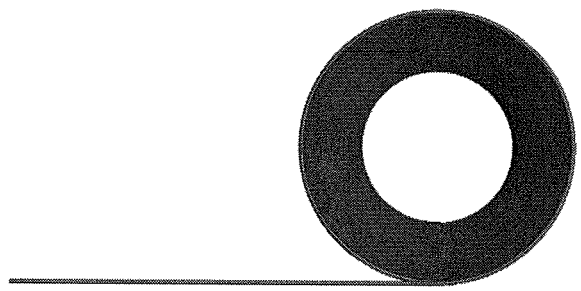
Figure 5:
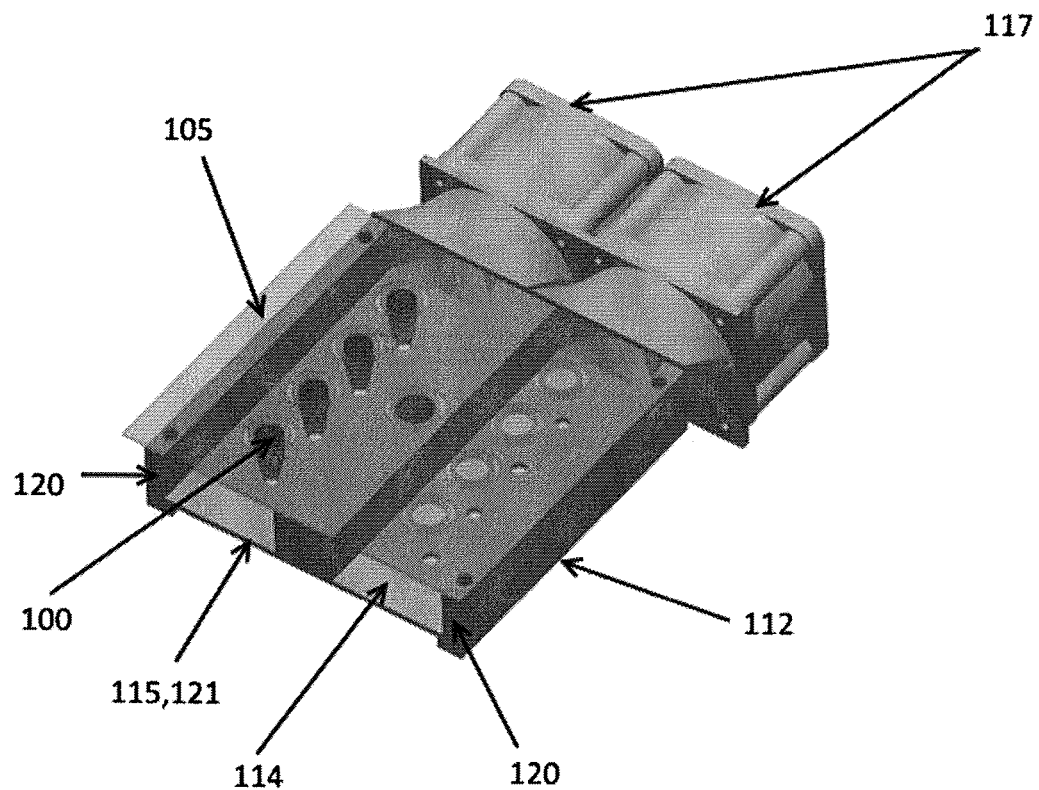
Figure 6:
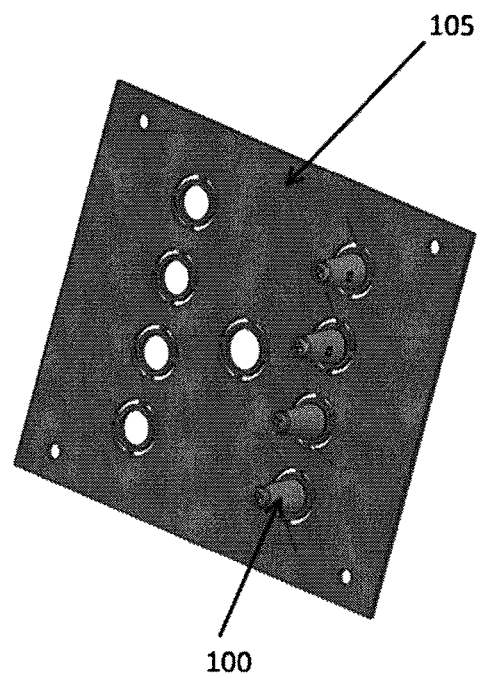
Figure 7:
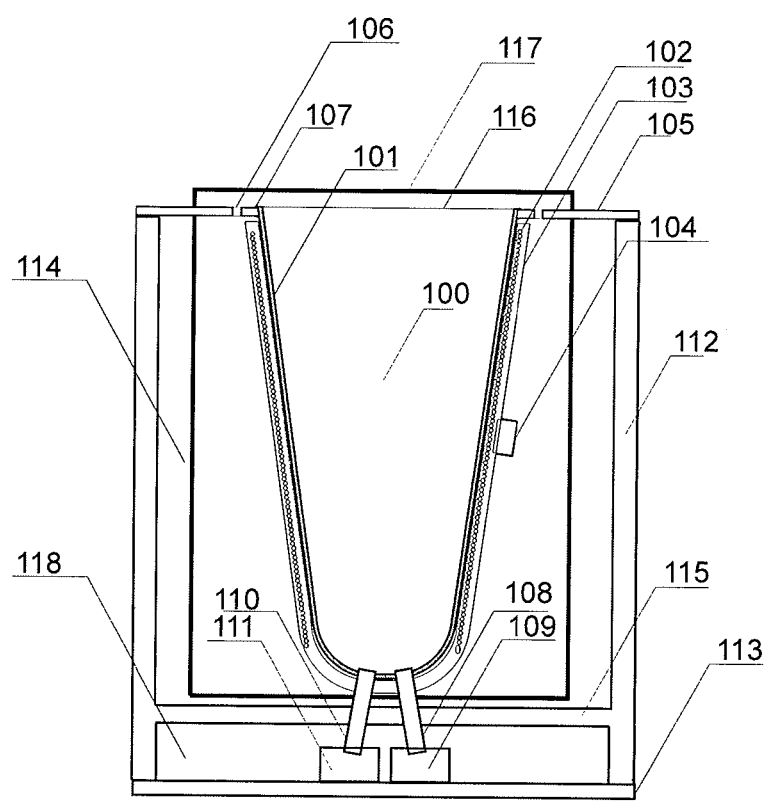
Figure 8:
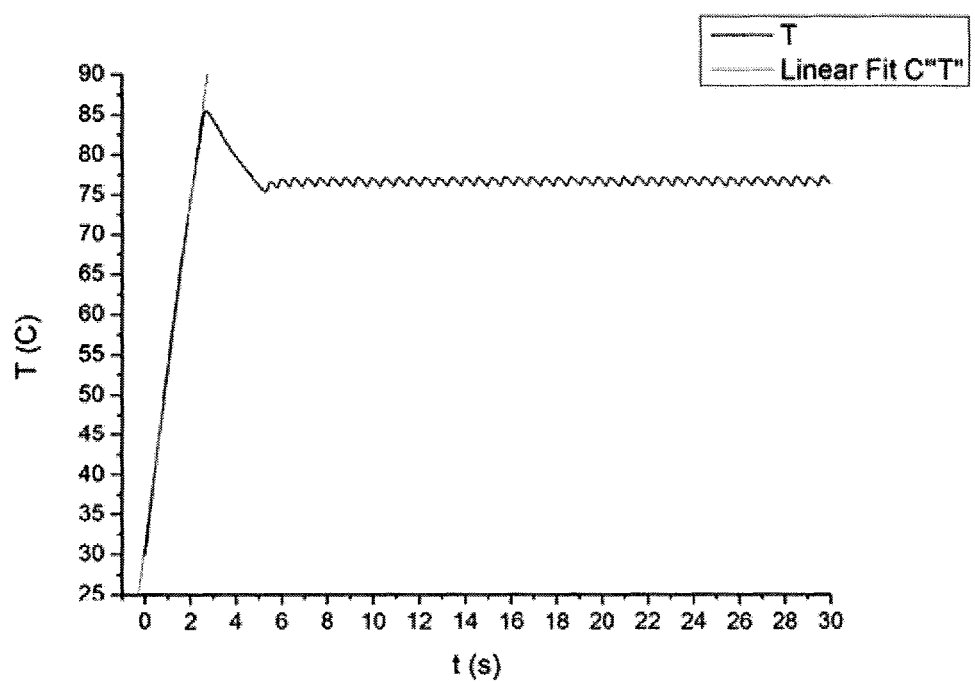
Figure 9:
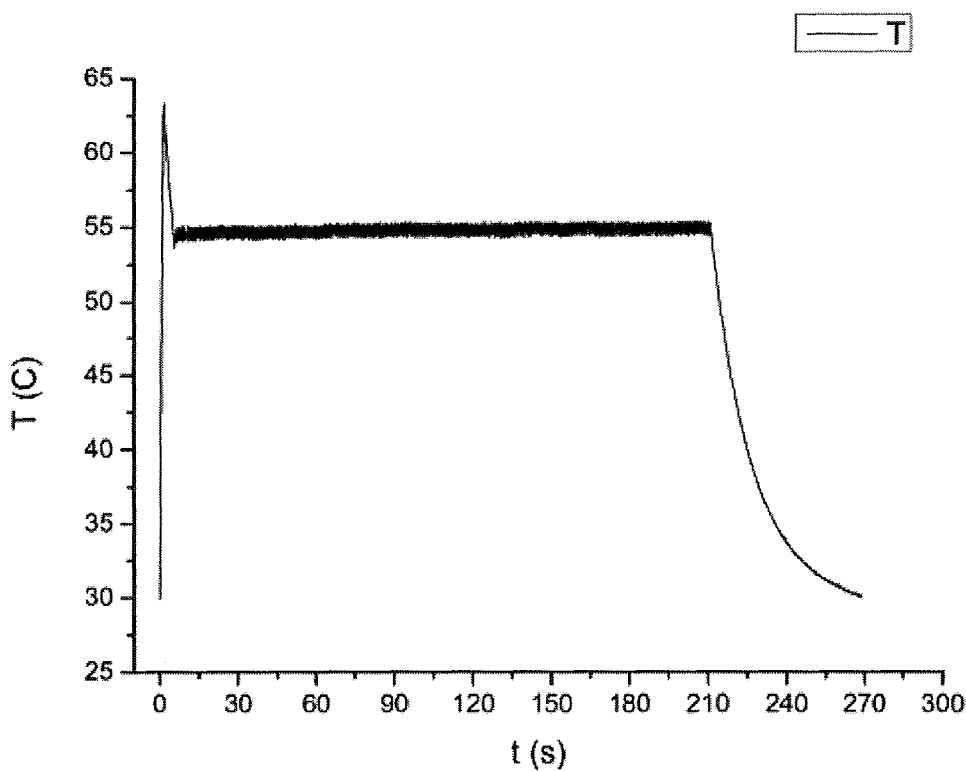
Figure 10:
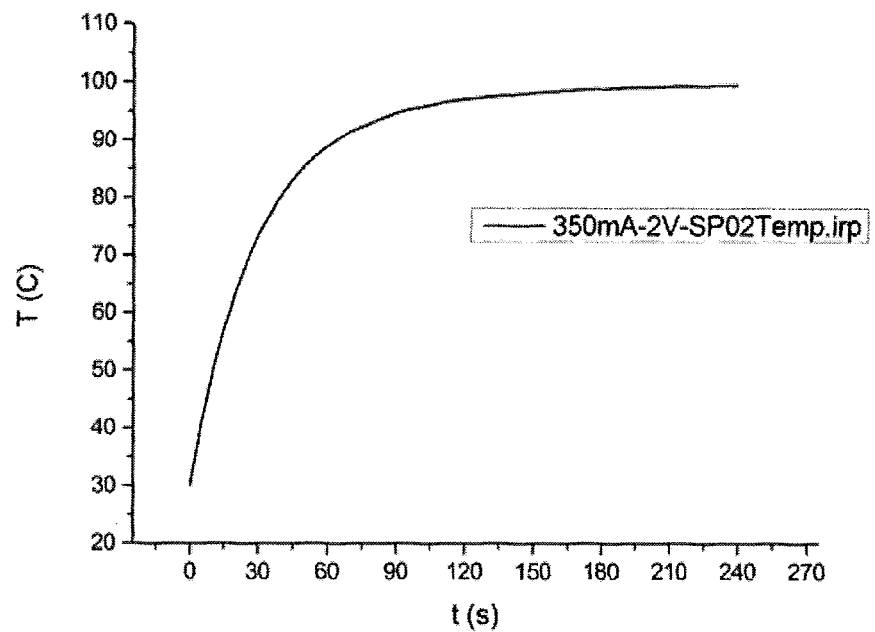
Figure 11:
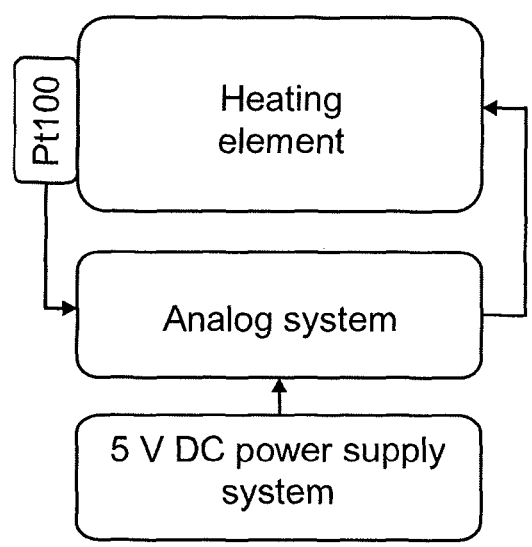
Figure 12:
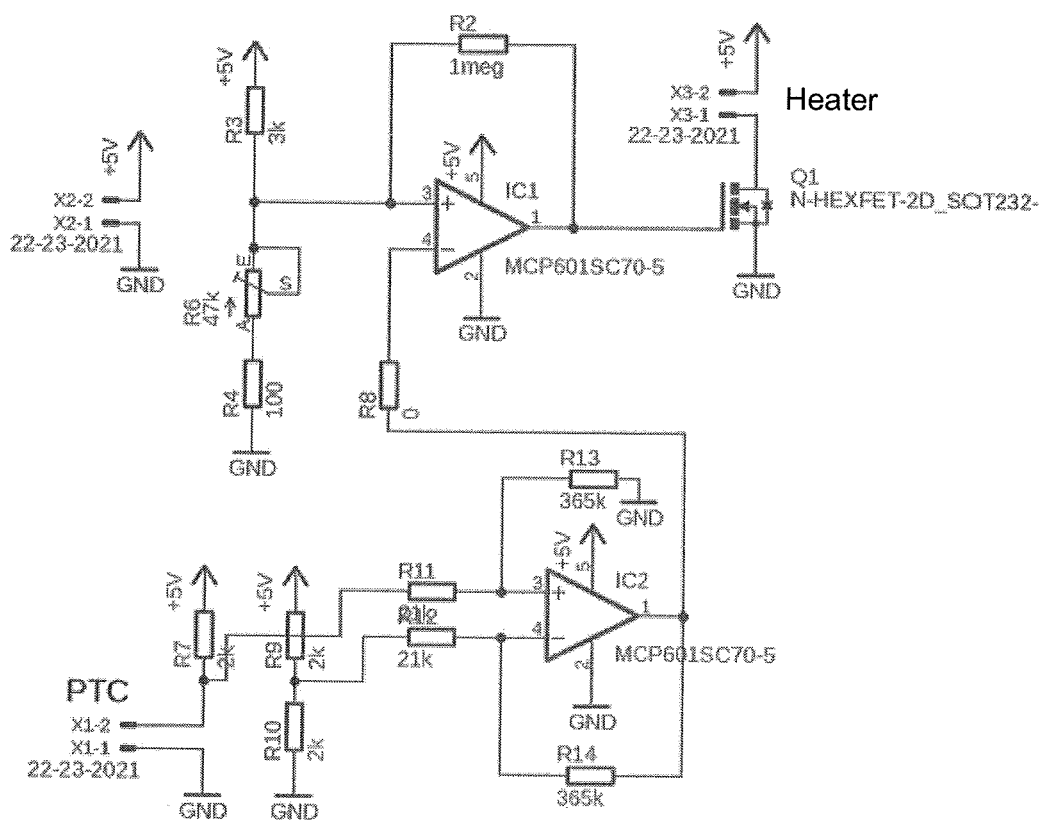
Figure 14:
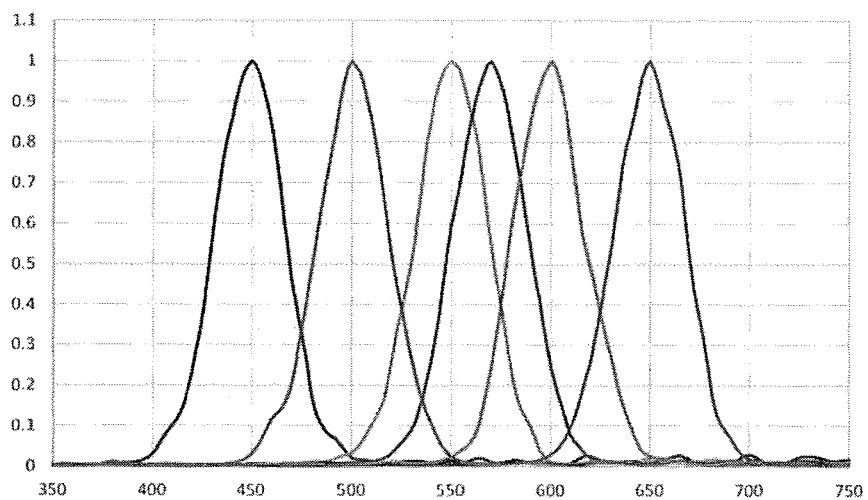
Figure 15:
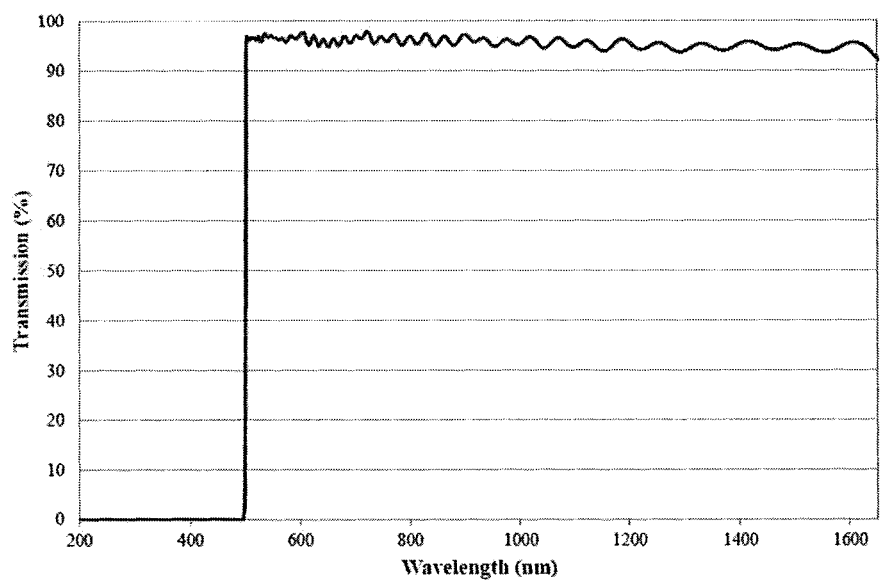

The embodiments of the invention are depicted on a drawings, on which the following are presented: FIGS. 1a, 1b and 1c are views of the winding wire section formed in shape of a cone, FIG. 2 is a diagram of bifilar wire, FIG. 3 is an outlook of the heating element, FIG. 4 is the heating element with the temperature sensor and protected with a polymer composite, FIG. 5 is the housing of the device, FIG. 6 is the PCB board with mounted heated slots, FIG. 7 is a cross-section of the device with the excitation and fluorescence detection assembly, FIG. 8 is a graph showing the temperature ramp dynamics in time, FIG. 9 is a graph of temperature ramp at lower values of temperature, FIG. 10 is a graph of power requirement at temperature stabilised at the level of 100° C., FIG. 11 is a block diagram of the analog temperature regulator, FIG. 12 is an electrical diagram of the temperature regulator, FIG. 13 is a block diagram of connections between the individual elements of the device with a microprocessor control system, FIG. 14 is a spectrum of the AS7262 system (the fluorescence detector), FIG. 15 is the transmission spectrum of the optic fibre with a filter.

EXAMPLE 1

Device Structure without the Optical System According to the Invention

The device is constructed of a three-piece housing, which is comprised of a fan 117 connected at the outlet to the housing 112 having one side open on the inside, in which, due to such a design, a U-shaped channel is formed, and a PCB board 105 with heating slots 100. The housing 112, which is shown in FIG. 5 and FIG. 7, is open on one side. This allows mounting the PCB board 105 with heating slots 100 in the device. The PCB board 105 is mounted to the housing of the walls 120 of the housing 112 by means of fastening openings (FIG. 5). And after placing it, a U-shaped air duct is closed and an air duct 114 is formed. The heating slots 100 are made of a number of layers. The heating slot 100 base is constituted by a heating sleeve 101 made of metal with high heat conductivity, e.g. copper formed in a shape corresponding to the shape of the reaction test tube, e.g. cone. Further, on the sleeve 101, a tightly wound winding wire 102 is present, FIG. 3, having a bifilar winding (FIG. 2) and the winding wire 102 has been additionally coated with a polymer composite layer 103 (FIG. 4). On the surface, formed by the bifilarly wound winding wire 102, a Pt100 or Pt1000 temperature sensor is located and only on top of it the polymer composite 103 is deposited. Such structure provides direct temperature reading and at the same time provides mechanical mounting and protection from the influence of outside conditions. The heating slot 100 is mounted to the PCB board 105 by means of a lead-free solder. Whereas on the PCB board 105, additional openings 106 are present, in order to limit the heat transfer from the slot 100 to the board 105. The board 105 is connected to the control system and the current supply.

The slot structure described above and illustrated in FIGS. 1 to 4 solves the technical problem. It provides precise control of the heating slot temperature. Moreover, through it, it is possible to power the heating slot independently, and therefore to independently control the temperature of the test tube inserted therein. Placing the heating slot or a slot assembly in the cooling channel provides rapid cooling. The independent control of the current controlling the heating of the sleeve results in low requirement for heating power for a single test tube, which is shown in FIG. 10. Additionally, the above structure is characterised by low mass, and a minimal heat capacity associated with it, as well as a low manufacturing cost. It results also in that, through it, a rapid temperature ramp is achieved.

EXAMPLE 2

Device Structure with the Optical System (FIG. 7)

The structure of this variant of the device is based on the design of example 1. A significant difference is comprised in the structure of the housing 112 of the air duct 114.

The housing 112 comprises an additional inner chamber 118, separated from the air duct with an insulating partition 115. The chamber 118 comprises an excitation and fluorescence measurement assembly comprised of the following elements: a fluorescence excitation diode optic fibre 108, a fluorescence excitation diode 109, optic fibre 110 with a filter for the fluorescence detector, fluorescence detector 111. The optic fibres are led from the chamber 118 to the channel 114 and are mounted on the bottom of the heating slot 100.

The embodiment according to the present invention has all the advantages of the solution shown in Example 1.

EXAMPLE 3

Determining the Temperature Parameters of the Device for a Single Heating Slot

On a station with a FLIR A40M thermal imaging camera, the temperature ramp time for an analog regulator power with 5V DC voltage was measured. The average current at the time of heating was 1.5 A, which results in power about 7.5 Watt. The function of temperature ramp in time is shown on the graph in FIG. 8. A linear approximation of the measured curve was performed and a linear relation of the temperature ramp over time having a ramp coefficient higher than 21° C. per second was obtained. After 3 seconds, an attempt to stabilise the temperature at the level of 77° C. takes place. The regulator does not comprise an ID member and was designed only for temperature ramp testing. In case of digital signal processing, a very good temperature stabilisation and lack of overregulation should be expected. Both the curve section after reaching maximum and its slope indicate a very rapid cooling of the heater even in case if an additional air cooling is not present.

The results were obtained using an analog temperature regulator having a diagram shown in FIG. 12.

EXAMPLE 4

Determining the Power Consumption Parameters for a Single Heating Slot According to the First Example The temperature measurement was conducted by means of a FLIR A40M thermal imaging camera. The energy requirement can be determined from the graph in FIG. 10. The graph shows that the power of 0.7 W is sufficient to maintain the temperature in a test tube having a 200 µl volume on 100° C. level. (0.35 A×2V).

The invention claimed is:

1. A device for conducting amplification reaction of biological samples with a system for independent control of the temperature of test tubes in a heating assembly comprising a multipart heating slot located in a cooling system housing, a control system, and a power supply system, characterised in that the heating assembly comprises at least one heating slot (100) comprising a metal heating sleeve (101) wound around with a bifilar winding wire made of enamelled winding wire (102), which is covered with a composite polymer layer (103), wherein a temperature sensor (104) is located on the surface of the winding wire, and at least one heating slot is mounted on a PCB control board (105) located on the cooling system housing (112).

2. The device according to claim 1, characterised in that the cooling system housing (112) comprises a fan (117) having an outlet, the outlet connected to a cooling system housing (112) of the air duct (114) for placing a PCB board (105) with a heating slot (100).

3. The device according to claim 1, characterised in that the cooling system housing (112) comprises two side walls (120) connected with each other by means of a third wall (115, 121).

4. The device according to claim 1, characterised in that the temperature ramp of the heating sleeve is at least 20° C./s.

5. The device according to claim 1, characterised in that the temperature sensor (104) is a platinum resistance temperature sensor with a resistance of 100 Ohm or 1000 Ohm.

6. The device according to claim 1, characterised in that the PCB board (105) is connected to the control system and to the power supply.

7. The device according to claim 1, characterised in that the cross-section of the heating slot (100) is circular.

8. The device according to claim 1, characterised in that the longitudinal cross-section of the heating slot (100) has a tapered cone shape.

9. The device according to claim 1, characterised in that the thickness of the heating sleeve (101) does not exceed 0.1 mm.

10. The device according to claim 1, characterised in that the heating sleeve (101) is made of copper.

11. The device according to claim 1, characterised in that the winding wire (102) is made of copper.

12. The device according to claim 1, characterised in that the winding wire (102) is enamelled with a polyurethane based enamel.

13. The device according to claim 1, characterised in that the PCB board (105) comprises a slit (106) reducing the heat transfer to the PCB board (105) from the heating slot (100).

14. The device according to claim 1, characterised in that an inner chamber (118) comprising an excitation and fluorescence measurement arrangement (108, 109, 110, 111) is located in the housing (112) of the air duct (114).

15. The device according to claim 1, characterised in that an excitation and fluorescence measurement arrangement is mounted on the housing (112) of the air duct (114) and comprises: an optic fibre (108) of the fluorescence excitation diode connected to the diode (109) for fluorescence excitation, an optic fibre (110) with a filter for the fluorescence detector connected to the fluorescence detector (111), wherein the excitation and fluorescence measurement arrangement is separated from the air duct (114) with an insulating surface (115), through which optic fibres of the excitation (108) and fluorescence measurement (110) arrangement are introduced.

16. The device according to claim 1, characterised in that an excitation and fluorescence measurement arrangement is connected to the heating slot by means of optic fibres (108, 110).

* * * * *